United States Patent [19]

Politycki

[11] 3,988,153

[45] Oct. 26, 1976

[54] METHOD OF FORMING A THIN FILM IRIS DIAPHRAGM FOR A CORPUSCULAR BEAM APPARATUS

[75] Inventor: Alfred Politycki, Ottobrunn, Germany

[73] Assignee: Siemens Aktiengesellschaft, Berlin & Munich, Germany

[22] Filed: May 21, 1975

[21] Appl. No.: 579,609

[30] Foreign Application Priority Data

May 27, 1974 Germany............................ 2425464

[52] U.S. Cl................................... 96/36.4; 96/36; 156/7; 156/18; 204/18 R; 204/23; 204/38 B; 250/505; 427/264; 427/265

[51] Int. Cl.² ........................................... G21K 1/00

[58] Field of Search ..................... 156/3, 7, 11, 18; 427/264, 265; 250/505, 311; 204/15, 18 R, 23, 38 B; 96/36, 36.4

[56] References Cited
UNITED STATES PATENTS

| | | | |
|---|---|---|---|
| 2,874,101 | 2/1959 | Larson | 156/11 |
| 3,227,880 | 1/1966 | Wideroe | 250/505 |
| 3,421,000 | 1/1969 | Lieber et al. | 250/505 |
| 3,449,221 | 6/1969 | Thomas | 204/15 |
| 3,847,689 | 11/1974 | Fletcher et al. | 156/18 |

Primary Examiner—William A. Powell
Assistant Examiner—Jerome W. Massie
Attorney, Agent, or Firm—Hill, Gross, Simpson, Van Santen, Steadman, Chiara & Simpson

[57] ABSTRACT

A method of forming an iris diaphragm for use in a corpuscular beam apparatus and having a thin metal layer with at least one opening and an integral reinforcing portion of the same metal which is set back from each of the openings characterized by providing a substrate with the first mask leaving an unexposed surface of the configuration of the thin metal layer, applying a thin metal layer on the exposed surface, forming a second mask having configuration of the reinforcing portion of the iris diaphragm and including a portion covering the thin metal layer adjacent each opening, applying a second thicker layer of the same metal to form a reinforcing portion and subsequently removing the iris diaphragm from the surface of the substrate. Preferably, each of the masks are formed by a photo development process and the metal layers are applied by electro-depositing.

8 Claims, 6 Drawing Figures

METHOD OF FORMING A THIN FILM IRIS DIAPHRAGM FOR A CORPUSCULAR BEAM APPARATUS

BACKGROUND OF THE INVENTION

1. Field of the Invention

The present invention is directed to a method of manufacturing thin film iris diaphragms for use in corpuscular beam apparatus such as electron microscopes and vidicons which iris diaphragms consist of a metal layer containing at least one opening in order to pass a beam of particles.

2. Prior Art

Iris diaphragms have been previously made from two separately manufactured components comprising a metal layer and a substrate or carrier plate. The metal layer is produced by depositing the metal on a profile surface of a template using a vapor metal deposition technique conducted under vacuum conditions. After forming the layer on the template, it is removed and secured to the substrate or carrier plate such as by brazing.

Since the rate of fouling of an iris diaphragm increases with the thickness of the metal layer, the metal layer must be as thin as possible. Due to this requirement for a thin layer, the above described process has a high risk of damage to the metal layer as it is being removed from the template and during the step of securing it to the carrier or substrate. In addition thereto, the above described process requires templates which are complex and expensive to manufacture and which can only be used a few times.

To overcome the above mentioned problems in the manufacture of iris diaphragms, it has been suggested to produce the diaphragms with the following method. A metal film is deposited directly on a carrier using for example electro-deposition methods with an appropriate mask. The carrier is subsequently etched in the area adjacent to the opening of the thin metal layer by a positive etching technique. Since the etching agent can only attack the unprotected areas of the carrier plate, the metal film or layer and the carrier must be made of different metals. While this process overcomes several difficulties experienced with the previous method, the different in the coefficient of thermal expansion and the difference in the thermal conductivity of the two metals used for the carrier member and the thin film subjects the iris diaphragm to distorsion when used in an apparatus subjected to temperature fluctuations. Thus, the thin film iris diaphragms produced by the proposed method are unsuitable for corpuscular beam apparatuses of the kind in which major temperature fluctuations will occur.

SUMMARY OF THE INVENTION

The present invention is directed to a method of manufacturing thin film iris diaphragms which have a film as thin as possible and have improved mechanical strength so that they retain their shape even in the presence of substantial temperature fluctuations. In addition, the method of the present invention enables production of iris diaphragms having a complicated structure as well as a plurality of iris diaphragms with minimum manufacturing expenses.

To accomplish these tasks, the present invention is directed to a method of manufacturing an iris diaphragm having a thin metal layer with at least one opening therethrough and an integral reinforcing portion of the same metal which is set back from the edge of each of the openings in the thin metal layer with the method comprising the step of providing a surface, forming a first mask on said surface, said mask leaving a portion of the surface exposed with the exposed surface having a configuration of the thin metal layer of the iris diaphragm, applying a thin metal coating to the exposed surface, forming a second mask on the first mask and thin metal layer, said second mask having a configuration of the reinforcing portion and covering a portion of the thin metal layer adjacent the edge of each opening therein, depositing a thick metal layer of the same metal as the thin metal layer to form the reinforcing portion and then removing the iris diaphragm from the surface and the masks. Preferably, the surface on which the first mask is applied is a metal base film applied either directly on a surface of a substrate or onto a bonding layer which has been applied to the substrate. By applying the first mask on the metal base film, the various metal layers may be applied by electrodepositing techniques. Since high resolution can be obtained by a photographic printing operation, each of the masks is preferably formed by utilizing a photosensitive material which is exposed and developed to form a mask of the desired configuration. In addition, the use of photographic printing to form the mask enables forming iris diaphragms having complicated shapes. For example ones with extremely small openings or central collectors. The use of photographic techniques also enables forming a plurality of iris diaphragms on the same substrate.

The method of the present invention enables the utilization of the same metal for both the thin film and the reinforcing portions so that the temperature fluctuations do not effect the shape of the thin film iris diaphragms. In addition, the process allows producing the thin film or layer to be extremely thin in the neighborhood of the openings so that the thin film iris diaphragm exhibits less tendency to become fouled during operation. Even with this thin metal film or layer of the diaphragm, the mechanical sensitivity is reduced due to the presence of the reinforcing portion so that handling of the thin iris diaphragm no longer presents the problems with regard to damage thereto.

DESCRIPTION OF THE PREFERRED EMBODIMENT

Figure 1:
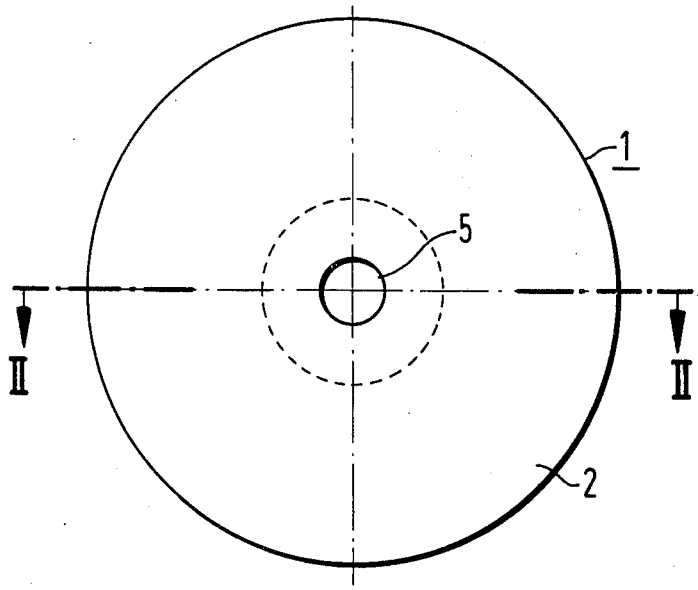
FIG. 1 is a plan view of an iris diaphragm made in accordance with the present invention.
Figure 2:
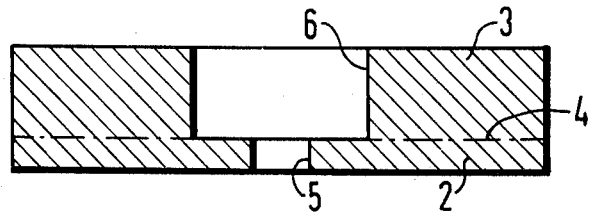
FIG. 2 is a cross-sectional view taken along lines II—II of FIG. 1.
Figure 3:
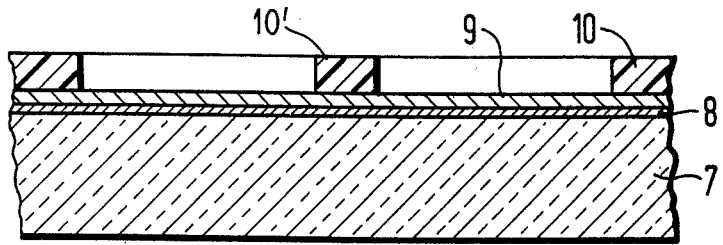
FIG. 3 is a partial cross-sectional view illustrating forming the mask on the substrate during manufacture of the iris diaphragm of FIGS. 1 and 2.

The principles of the present invention are particularly useful in producing an iris diaphragm 1 illustrated in FIGS. 1 and 2. The iris diaphragm 1 is a one piece component and consists of a thin metal layer or film 2 and a reinforcing portion or consolidating film 3 which are both formed of the same metal and are integral with each other at a boundary surface 4 which is illustrated by chain lines. At the center of the thin metal layer 2 is a circular iris aperture 5. The reinforcing portion or consolidating film 3 is set back from the edge of the opening or aperture 5 to form a concentric enlarged passageway or aperture 6. As illustrated, the edge of the opening 5 is extremely smooth and has no ragged formations, and therefore fouling of a beam of particles passing through the aperture 5 is minimized.

To manufacture the iris diaphragm 1, the preferred method includes providing a glass substrate 7 having an upper surface on which a bonding layer 8 of nickel chrome (CrNi) is applied in the thickness of 0.01 $\mu$m. On the bonding layer 8 a metal base film 9, such as copper, of a thickness of about 0.1 $\mu$m is applied either by vaporization or an atomizing operation. The bonding layer or film 8 was selected from a material which is a metal or metal alloy which will improve adhesion between the glass substrate 7 and the metal base film 9. With the proper selection of the bonding layer or film 8, it is possible to employ metals for a base film 9 which metal would readily peel from the substrate 7. However, for certain metals used as the base metal film, the presence of a bonding layer 8 is not necessary.

After applying the metal base film 9, a first mask 10 is applied to masked portions of the base metal film 9 and leave unexposed portions corresponding to the thin metal layer 2 of the iris diaphragm 1. Preferably, the first mask 10 is provided by a photographic process comprising covering the base film 9 with a coating of a photographic varnish which is resistant to electrodeposition. This coating of photographic varnish is applied in a thickness of approximately 2 $\mu$m and is then selectively exposed by illumination and developed to provide the mask with the negative image of the thin metal layer 2 and to expose the base film 9 with a configuration of the thin metal layer 2. As illustrated, the mask 10 has a portion 10' to define the opening 5 and a concentric outer portion.

Figure 4:
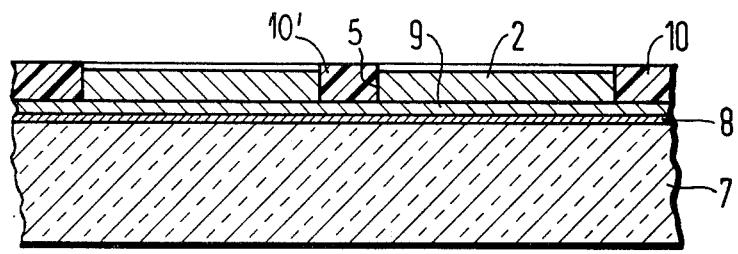
FIG. 4 illustrates a cross-sectional view illustrating the formation of the thin metal layer.

As illustrated in FIG. 4, after producing the first mask 10, the exposed areas of a metal base film 9 which are left exposed or are not covered by the first mask 10 receive a thin metal layer 2 which is built up to a thickness of approximately 1.5 $\mu$m. Preferably, the thin metal layer 2 is formed by electro-deposition of gold on the base film 9. The portion 10' of the mask causes the formation of aperture 5 in the layer 2.

Figure 5:
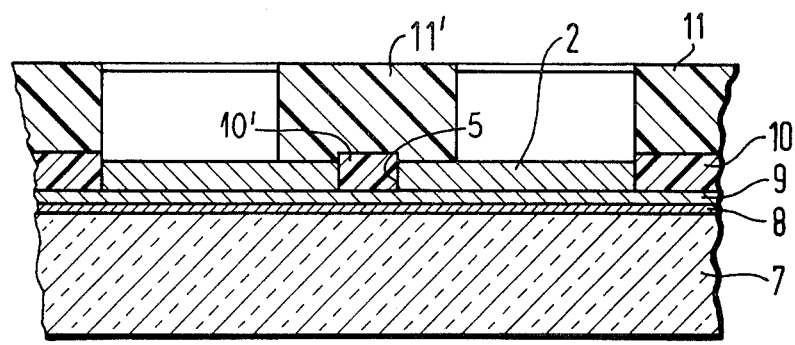
FIG. 5 is a partial cross-sectional view illustrating the step of applying the second mask.

Subsequent to forming the thin metal layer 2, a second mask 11 is applied on portions of the first mask 10 and portions of the thin metal layer 2. As illustrated, the second mask 11 is a negative image of the reinforcing or consolidating layer 3 and has a portion 11' which covers a portion 10' which forms the opening or aperture 5 in the base metal layer 5 and also covers a circular portion of the thin metal layer 2 which is adjacent to the edge of the opening 5. Preferably, the second mask 11 has a thickness of about 5 to 10 $\mu$m and is formed by applying a coating of photographic or photo-sensitive varnish, exposing by illuminating select areas of the photographic varnish and developing to leave the particular mask structure 11 illustrated in FIG. 5.

Subsequent to forming the mask 11, a second thick layer of metal 3 is deposited on the thin layer 2 to form the reinforcing portion or consolidating layer 3. The thick layer is formed of the same metal, such as by electro-depositing of gold, and has a thickness of from 3 to 10 $\mu$m. As illustrated, the outer portion of the mask 11 coincides and is aligned with the outer portion of the mask 10 so that the thin layer 2 and the reinforcing portion 3 have the same outer circumference. The mask 11 will delimit the outer edge of the reinforcing portion 3. If the outer annular zone of the mask 11 were omitted, then the layer 3 forming the reinforcing portion will overlap and extend passed the edge of the layer 2. However, this will not interfere with the use of the iris diaphragm 1 in a corpuscular beam apparatus.

Figure 6:
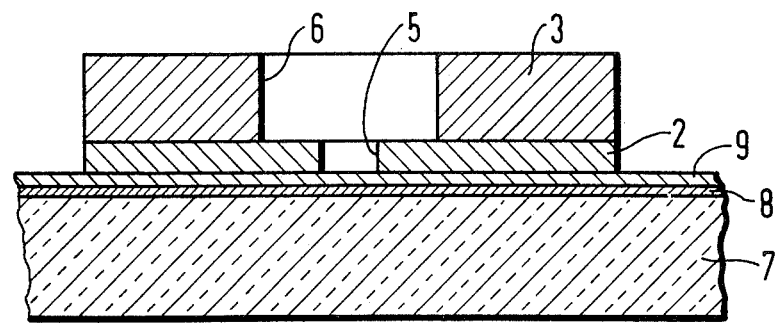
FIG. 6 illustrates the formation of the iris diaphragm prior to removal from the substrate.

As illustrated in FIG. 6, the masks 10 and 11 have been removed and the iris diaphragm 1 is still disposed on the base film 9. To remove the iris diaphragm from the substrate 7 and the metal layers 8 and 9, the metal base film 9 is selectively etched away.

In the above description, the iris diaphragm was formed of gold and it has been found advantageous to use copper for the metal base film 9 and nickel chrome as a bonding layer 8 on the glass substrate 7. Other materials can be used to form the iris diaphragm. For example, to form the iris diaphragm of nickel, silver should be used as a metal base film 9. If copper is to be used for the iris diaphragm, then the base film is not required and the various copper layers to form the thin metal layer 2 and the reinforcing portion 3 can be applied by other depositing procedures such as vaporizing or atomizing operations.

While the above described method as illustrated in FIGS. 3–6 was directed to a method for producing a single iris diaphragm on the glass substrate 7, it is possible to simultaneously manufacture a very large number of iris diaphragms, for example between 500 and 2000 on a single glass substrate. This is accomplished by sequentially forming a plurality of the photographic masks in the coating of photo-sensitive material during the steps of forming the first mask. During the step of forming the second mask, a second mask is formed for each one of the first masks and aligned therewith.

The method of the present invention enables production of an iris diaphragm which on one hand has a metal film or layer that is as thin as possible and yet on the other hand has improved mechanical stability and strength so that it is not subject to damage during handling. Since the thick layer forming the reinforcing portion 3 is of the same material as the thin layer 2, the iris diaphragm 1 is less susceptible to distorsion and loss of shape when subjected to substantial temperature fluctuations which may occur in a corpuscular beam apparatus. It is also noted that since the thin metal layer forming the thin film or layer 2 of the diaphragm is not handled prior to the application of the reinforcing portion, the thickness of this layer can be extremely thin without risking damage due to subsequent handling.

Although various minor modifications may be suggested by those versed in the art, it should be understood that I wish to employ within the scope of the patent granted hereon, all such modifications as reasonably and properly come within the scope of my contribution to the art.

I claim:

1. A method of manufacturing a thin film iris diaphragm having at least one opening for passing a beam of particles of a corpuscular beam apparatus, in particular electron microscopes and vidicons, said iris diaphragm having a thin metal layer with at least one opening therethrough and an integral reinforcing portion of the same metal which is set back from the edge of each of the openings in the thin metal layer, said method comprising the steps of providing a substrate; applying at least one metal base film on a surface of the substrate; forming a first mask having a negative image of the configuration of the thin metal layer of the iris diaphragm on the metal base film by depositing on the base metal film a first coating of photo-sensitive material which is resistant to electro-depositing, by exposing selected areas of the first coating, and by developing the coating to form the first mask; electro-depositing a thin metal layer on the base film; forming a second mask having a negative image of the configuration of the reinforcing portion by applying a second coating of photo-sensitive material which is resistant to electro-depositing on the first coating and metal layer, by exposing the second coating of material with a negative image of the reinforcing portion, and by developing the second coating to form the second mask with a portion covering each opening of the thin metal layer and the thin metal layer surrounding each opening; electro-depositing a thick layer of the same metal as the thin metal layer to form the reinforcing portion; removing said masks; and then removing the substrate by selectively etching away the base metal film.

2. A method according to claim 1, wherein the step of forming both the first and second masks form a plurality of spaced first masks and an aligned second mask for each first mask so that a plurality of iris diaphragms are formed by the steps of electro-deposition.

3. A method according to claim 1, which prior to the step of applying the metal base film on the substrate, includes the step of applying a bonding layer on the substrate so that a better bond of the metal base film on the substrate is obtained.

4. A method according to claim 3, wherein the step of forming the first mask comprises forming a plurality of first masks and wherein the step of forming the second mask includes forming an aligned second mask for each first mask so that a plurality of iris diaphragms are formed on the substrate.

5. A method of manufacturing a thin film iris diaphragm having at least one opening for passing a beam of particles of a corpuscular beam apparatus such as electron microscopes and vidicons, said iris diaphragm having a thin metal layer with at least one opening therethrough and an integral reinforcing portion of the same metal which is set back from the edge of each opening in the thin metal layer, said method comprising the steps of providing a surface; forming a first mask on said surface, said mask leaving a portion of the surface exposed with the exposed surface having a configuration of the thin metal layer of the iris diaphragm, galvanically applying a thin metal layer to the exposed surface; forming a second mask on the first mask and thin metal layer, said second mask having a configuration of the reinforcing portion and covering a portion of the thin metal layer adjacent the edge of each opening therein, galvanically depositing a thick layer of the same metal as the thin metal layer to form the reinforcing portion and then removing the iris diaphragm from the surface and the masks thereon.

6. A method according to claim 5, wherein the step of providing the surface comprises providing a substrate having a metal base film provided thereon to form the surface.

7. A method according to claim 5, wherein the step of providing the surface comprises providing a substrate having a surface and depositing a metal base film on the surface.

8. A method according to claim 7, wherein prior to the step of depositing the metal base film on the surface of the substrate, a thin bonding layer is applied to facilitate the adhesion of the metal base film to the substrate.

* * * * *